(12) United States Patent
Hikida et al.

(10) Patent No.: US 7,851,853 B2
(45) Date of Patent: Dec. 14, 2010

(54) SEMICONDUCTOR DEVICE COMPRISING HIGH-WITHSTAND VOLTAGE MOSFET AND ITS MANUFACTURING METHOD

(75) Inventors: Satoshi Hikida, Nara (JP); Takuya Otabe, Fukuyama (JP); Hisashi Yonemoto, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 441 days.

(21) Appl. No.: 11/947,214

(22) Filed: Nov. 29, 2007

(65) Prior Publication Data
US 2008/0135973 A1   Jun. 12, 2008

(30) Foreign Application Priority Data
Dec. 8, 2006  (JP)  ............... 2006-331320
Oct. 24, 2007  (JP)  ............... 2007-276178

(51) Int. Cl.
H01L 29/00   (2006.01)
H01L 21/00   (2006.01)

(52) U.S. Cl. ................. 257/330; 257/339; 257/E29.26; 257/E29.258; 438/270; 438/589

(58) Field of Classification Search ................. 257/409, 257/343, 345, 346, 339, 340, 330, 500, 501, 257/506, E29.27, E29.269, E29.028, E29.027, 257/492, E29.26, E29.258; 438/270, 589
See application file for complete search history.

(56) References Cited
U.S. PATENT DOCUMENTS
4,419,810 A * 12/1983 Riseman ................... 438/303

| | | | |
|---|---|---|---|
| 6,518,623 B1 * | 2/2003 | Oda et al. | 257/330 |
| 7,675,110 B2 * | 3/2010 | Uchiyama | 257/330 |
| 2004/0089892 A1 | 5/2004 | Suzuki | |

FOREIGN PATENT DOCUMENTS

| JP | 6-151453 | 5/1994 |
|---|---|---|
| JP | 2002-343963 | 11/2002 |

* cited by examiner

Primary Examiner—Victor A Mandala
Assistant Examiner—Scott Stowe
(74) Attorney, Agent, or Firm—Nixon & Vanderhye P.C.

(57) ABSTRACT

The high-withstand voltage MOSFET comprises a trench portion formed at the high-withstand voltage active region on a semiconductor substrate, two polysilicon layers formed on the high-withstand voltage active region on both sides of the trench portion by implanting an impurity of the conductivity type opposite to the high-withstand voltage active region, two impurity diffusion drift layers formed on both sides of the trench portion by implanting an impurity of the conductivity type opposite to the high-withstand voltage active region in the surface of the high-withstand voltage active region under the polysilicon layers, and a gate electrode formed through a gate oxide film on bottom and side surfaces of the trench portion and end surfaces and upper surfaces of adjacent regions of the polysilicon layers close to the trench portion, and source and drain regions are formed in the two polysilicon layers excluding the adjacent regions covered with the gate electrode.

25 Claims, 14 Drawing Sheets

SEMICONDUCTOR DEVICE COMPRISING HIGH-WITHSTAND VOLTAGE MOSFET AND ITS MANUFACTURING METHOD

CROSS REFERENCE TO RELATED APPLICATION

This Nonprovisional application claims priority under 35 U.S.C. §119(a) on Patent Application No. 2006-331320 filed in Japan on 8 Dec. 2006 and Patent Application No. 2007-276178 filed in Japan on 24 Oct. 2007 the entire contents of which are hereby incorporated by reference.

BACKGROUND OF THE INVENTION

1. Field of the Invention

The present invention relates to a semiconductor device comprising a high-withstand voltage MOSFET and its manufacturing method and more particularly, to a semiconductor device comprising both high-withstand voltage MOSFET and low-withstand voltage MOSFET and its manufacturing method.

2. Description of the Related Art

The high-withstand voltage MOSFET is very large in size as compared with the low-withstand voltage MOSFET because it is necessary to have a long gate length to ensure a punch through withstand voltage and a low-concentration diffusion region as a drift region. Especially, a lateral type high-withstand voltage MOSFET in which source and drain regions are arranged in a lateral direction along a semiconductor substrate surface is very large in size.

Conventionally, various kinds of techniques for reducing the size of such large lateral type high-withstand voltage MOSFET have been proposed. As one of the above technique for reducing the size, Japanese Unexamined Patent Publication No. 06-151453 discloses a method in which a drift region is formed in a vertical direction to largely reduce the size of the drift region in the high-withstand voltage MOSFET. An element structure of the high-withstand voltage MOSFET will be described with reference to FIG. 7. As shown in FIG. 7, a gate electrode 102 is formed on a semiconductor substrate 100 through a gate insulation film 101, trenches 103 are formed in the semiconductor substrate 100 on both sides of the gate electrode 102, an electric field alleviation layer 104 (drift region) is provided on a trench sidewall on the side of the gate electrode 102, and source and drain regions 105 are formed on the semiconductor substrate 100 on the bottom side of the trench.

In addition, as a method for suppressing a short channel effect and reducing a transistor size in a lateral type MOSFET, various kinds of trench gate type MOSFET are proposed and one of them is disclosed in Japanese Unexamined Patent Publication No. 2002-343963. A manufacturing method of the above trench gate type MOSFET will be described with reference to FIG. 8.

An element isolation region 111 is formed on a semiconductor substrate 110 (refer to FIG. 8A) and then a source and drain region 112 is formed by impurity ion implantation (refer to FIG. 8B). Then, a CVD oxide film 113 is deposited and the CVD oxide film 113 of a channel region of a transistor is opened and at the same time, the Si layer of the source-drain region 112 is etched away to provide a first Si trench 114 (refer to FIG. 8C). Next, by using a combination of CVD (chemical vapor deposition) and anisotropic etching, a sidewall 115 is formed of an insulation film such as an oxide film on a side wall of the first trench and at the same time, a second Si trench 116 is formed (refer to FIG. 8D). Then, a gate oxide film 117 is grown on the bottom of the second Si trench 116 by thermal oxidation. Then, the first and second trenches 114 and 116 are filled with a gate electrode material such as polysilicon, whereby a gate electrode 118 is formed (refer to FIG. 8E).

According to the high-withstand voltage MOSFET disclosed in the Japanese Unexamined Patent Publication No. 06-151453, although the size of the drift region in the high-withstand voltage transistor can be smaller than the conventional one, a channel length to ensure the punch through withstand voltage cannot be reduced. In addition, since the trench part becomes very high stepped part, it is difficult to miniaturize the semiconductor device comprising both high-withstand voltage transistor and low-withstand voltage transistor as a whole.

Furthermore, according to the trench gate type MOSFET disclosed in the Japanese Unexamined Patent Publication No. 2002-343963, although there is an effect in reduction in size of a fine transistor having a low power supply voltage (<1.8 v), the above element structure cannot be applied as it is to the high-withstand voltage MOSFET (10 to 50 v) requiring the drift region for alleviating an electric field.

SUMMARY OF THE INVENTION

The present invention was made in view of the above problems and it is an object of the present invention to provide a semiconductor device comprising a lateral type high-withstand voltage MOSFET in which a low-withstand voltage transistor can be provided together and the miniaturization and adjustment of a withstand voltage can be easily implemented.

A semiconductor device according to an aspect of the present invention to attain the above object comprises an element isolation region, an active region separated by the element isolation region, and a high-withstand voltage MOSFET formed in a high-withstand voltage active region of at least one section of the active region on a semiconductor substrate, and it is characterized as first characteristics in that the high-withstand voltage MOSFET comprises a trench portion formed at the high-withstand voltage active region of a first conductivity type, two polysilicon layers formed on the high-withstand voltage active region on both sides of the trench portion by implanting an impurity of a second conductivity type opposite to the first conductivity type, two impurity diffusion drift layers positioned in the both sides of the trench portion and formed by implanting an impurity of the second conductivity in the surface of the high-withstand voltage active region under the polysilicon layers, and a gate electrode formed through a gate oxide film on the bottom and side surfaces of the trench portion and the end surface facing the trench portion and the upper surface of an adjacent region of each of the polysilicon layers close to the trench portion, and a source region and a drain region are formed in parts of the two polysilicon layers not covered with the gate electrode, other than the adjacent regions.

According to the semiconductor device having the first characteristics, since the channel region is formed under the trench portion, the drift layer does not extend in a channel direction due to diffusion, the short channel effect is suppressed and the gate length is reduced, so that the channel length to ensure the punch through withstand voltage and the drift length serving as the electric field alleviation layer can be reduced. In addition, the adjacent region of the polysilicon layer functions as a drift layer together with the impurity diffusion drift layer, so that these drift layers and the channel region can be formed by self alignment due to the trench portion. As a result, the high-withstand voltage MOSFET can be considerably reduced in size.

Furthermore, since the overlapped amount of the gate electrode above the polysilicon layer and the adjacent region of the polysilicon layer can be easily adjusted by photolithography, the withstand voltage can be easily adjusted. Therefore, even when the operation voltage specification of the semiconductor device is changed, it is not necessary to change the manufacturing process for forming the high-withstand voltage MOSFET.

Further preferably, according to the semiconductor device in the present invention, the trench portion has a depth from the surface of the high-withstand voltage active region deeper than that of the impurity diffusion drift layer. Therefore, when the trench portion is formed in the impurity diffusion drift layer later, since the trench portion is deeper, the impurity diffusion drift layer can be formed by self alignment on both sides of the trench portion. As a result, the channel region and the impurity diffusion drift layer can be formed under the trench portion by self alignment.

In addition, it is preferable that the depth of the trench portion from the surface of the high-withstand voltage active region is within a range of 300 to 900 nm and it is also preferable that the gate length defined by the width of the trench portion between the two polysilicon layers is within a range of 300 to 1200 nm.

Further preferably, the semiconductor device according to the present invention is characterized as second characteristics in that at least one of the two polysilicon layers is formed so as to be extended from the upper surface of the active region to the upper surface of the element isolation region. Here, preferably, the source region or the drain region is formed in the polysilicon layer above the element isolation region.

According to the semiconductor device having the second characteristics, at least one of the source region and the drain region can be arranged above the element isolation region, and parasitic capacity generated between one of the source and drain regions and the semiconductor substrate can be reduced, so that the high-withstand voltage MOSFET can operate at higher speed. In addition, since the element isolation region can be effectively used, the high-withstand voltage MOSFET can be considerably reduced in size.

Further preferably, according to the semiconductor device in the present invention, in addition to the any one of the above characteristics, the length of the adjacent region of each of the two polysilicon layers in a direction away from the trench portion is within a range of 200 to 1000 nm and the withstand voltage of the high-withstand voltage MOSFET is adjusted within a range of 10 to 40 V according to the length of the adjacent region.

Further preferably according to the semiconductor device in the present invention, a silicide film is formed on the upper surfaces of the source region and the drain region of the two polysilicon layers and the upper surface of the gate electrode. Thus, wiring resistance of each electrode of the source, the drain and the gate can be reduced, so that the high-withstand voltage MOSFET can operate at higher speed.

Further preferably, according to the semiconductor device in the present invention, a low-withstand voltage MOSFET is formed at another section of the active region in which the high-withstand voltage MOSFET is not formed. Here, it is preferable that the gate electrodes of the high-withstand voltage MOSFET and the low-withstand voltage MOSFET are formed of the same material at the same time. Thus, a logic circuit comprising the low-withstand voltage MOSFET can be mounted on the semiconductor device in the present invention. In addition, since the low-withstand voltage MOSFET and the high-withstand voltage MOSFET have structures suitable for miniaturization, the low-withstand voltage MOSFET and the high-withstand voltage MOSFET can be miniaturized as much as possible according to generation change of a processing technique. In addition, when the gate electrodes of the low-withstand voltage MOSFET and the high-withstand voltage MOSFET are formed of the same material at the same time, a part of the process for the low-withstand voltage MOSFET and the high-withstand voltage MOSFET can be shared, so that the manufacturing process can be simplified and the manufacturing cost can be reduced.

Furthermore, a manufacturing method of the semiconductor device according to the present invention to attain the above object is characterized as first characteristics in that a step for forming the high-withstand voltage MOSFET of the semiconductor device having the above characteristics comprises a step of forming the element isolation region on the semiconductor substrate, a step of forming the high-withstand voltage active region of the first conductivity type in at least one section of the active region, a step of forming the polysilicon layer and a first oxide film on the upper surface of the high-withstand voltage active region, a step of implanting an impurity ion of the second conductivity type in the polysilicon layer and the surface of the high-withstand voltage active region through the first oxide film, a step of forming a trench portion penetrating the first oxide film, the polysilicon layer and a surface part of the impurity ion-implanted high-withstand voltage active region and having an opening at the upper side, a step of depositing a gate oxide film and a gate electrode material film on the side and bottom surfaces of the trench portion and the upper surface of the first oxide film, a step of forming the gate electrode by patterning the gate electrode material film, and a step of forming the source region and the drain region by implanting an impurity ion of the second conductivity type in a part of the polysilicon layer not covered with the gate electrode.

Furthermore, a manufacturing method of the semiconductor device according to the present invention is characterized as second characteristics in that the process for forming the high-withstand voltage MOSFET of the semiconductor device having the above characteristics comprises a step of forming the element isolation region on the semiconductor substrate, a step of forming the high-withstand voltage active region of the first conductivity type in at least one section of the active region, a step of implanting an impurity ion of the second conductivity type in the surface of the high-withstand voltage active region, a step of forming the polysilicon layer and a first oxide film on the upper surface of the impurity ion-implanted high-withstand voltage active region, a step of forming a trench portion penetrating the first oxide film, the polysilicon layer and the surface part of the impurity ion-implanted high-withstand voltage active region and having an opening at the upper side, a step of depositing a gate oxide film and a gate electrode material film on the side and bottom surfaces of the trench portion and the upper surface of the first oxide film, a step of forming the gate electrode by patterning the gate electrode material film, and a step of forming the source region and the drain region by implanting an impurity ion of the second conductivity type in a part of the polysilicon layer not covered with the gate electrode.

According to the manufacturing method of the semiconductor device having the first or second characteristics, the semiconductor device implementing the effect of the first characteristics can be manufactured.

Furthermore, the manufacturing method of the semiconductor device according to the present invention preferably comprises a step of forming a channel stopper region by implanting an impurity ion of the first conductivity type in an inner region of the high-withstand voltage active region under the bottom of the trench portion, the step of forming the channel stopper region being performed between the step of forming the trench portion, and the step of depositing the gate oxide film and the gate electrode material film on the side and bottom surfaces of the trench portion and the upper surface of the first oxide film, in addition to the first or second characteristics. Thus, the impurity ion-implanted region of the inner region can function as a channel stopper and suppress the short channel effect.

Furthermore, the manufacturing method of the semiconductor device according to the present invention preferably comprises a step of forming a channel stopper region under the impurity diffusion drift layer formed on the surface of the high-withstand voltage active region by implanting the impurity ion of the first conductivity type in the surface of the high-withstand voltage active region, in addition to the any of the above characteristics. Thus, the lower region of the impurity diffusion drift layer can function as a channel stopper and suppress the short channel effect.

Further preferably, the manufacturing method of the semiconductor device according to the present invention comprises a step of forming the channel stopper region by implanting an impurity ion of the first conductivity type in the lower region of the impurity diffusion drift layer by implanting the impurity ion of the first conductivity type in the surface of the high-withstand voltage active region, between the step of forming the trench portion and the step of depositing the gate electrode material film. Thus, the impurity ion-implanted place at the lower region of the impurity diffusion drift layer can function as a channel stopper and suppress the short channel effect. In addition, since the channel stopper region can be formed by self alignment, the process can be simplified and the manufacturing cost can be reduced.

Furthermore, according to the manufacturing method of the semiconductor device in the present invention, it is preferable that the step of forming the high-withstand voltage active region of the first conductivity type uses the same mask for implanting the impurity ion as the step of forming the channel stopper region. Thus, the process can be simplified and the manufacturing cost can be reduced.

Furthermore, according to the manufacturing method of the semiconductor device in the present invention, it is preferable that the step of forming the high-withstand voltage active region of the first conductivity type is performed between the step for forming the trench portion and the step of depositing the gate electrode material film, and the processes from the step of forming the element isolation region to the step of forming the trench portion are performed in a region to become the high-withstand voltage active region, instead of the high-withstand voltage active region, in addition to the any of the above characteristics. Thus, the variation in threshold voltage of the high-withstand voltage MOSFET caused by the variation in depth of the trench portion can be suppressed.

Further preferably, a manufacturing method of the semiconductor device according to the present invention further comprises a step of forming a low-withstand voltage MOSFET and the step for forming the low-withstand voltage MOSFET comprises a step of forming a low-withstand voltage active region of the first conductivity type in at least one section of the active region, other than the high-withstand voltage active region after the element isolation region has been formed, a step of forming a gate oxide film for the low-withstand voltage MOSFET on the surface of the low-withstand voltage active region, a step of depositing a gate electrode material film for the low-withstand voltage MOSFET while depositing the gate electrode material film at the step of forming the high-withstand voltage MOSFET with the same material, a step of forming a low-withstand voltage gate electrode by patterning the gate electrode material film for the low-withstand voltage MOSFET while patterning the gate electrode material film at the step for forming the high-withstand voltage MOSFET, and a step of forming a source region and a drain region for the low-withstand voltage MOSFET by implanting an impurity ion of the second conductivity type in the surface of the low-withstand voltage active regions on both sides of the low-withstand voltage gate electrode.

Furthermore, it is preferable that the impurity ion implantation of the second conductivity type at the step of forming the source region and the drain region in the step of forming the high-withstand voltage MOSFET, and the impurity ion implantation of the second conductivity type at the step of forming the source region and the drain region in the step of forming the low-withstand voltage MOSFET are performed at the same time.

When the step of forming the low-withstand voltage MOSFET is further provided, a semiconductor device comprising the high-withstand voltage MOSFET and a logic circuit having the low-withstand voltage MOSFET can be provided. In addition, since a part of the step of forming the low-withstand voltage MOSFET and the high-withstand voltage MOSFET is shared, the manufacturing process can be simplified as the whole semiconductor device and the manufacturing cost can be reduced.

DETAILED DESCRIPTION OF THE INVENTION

Embodiments of a semiconductor device and its manufacturing method according to the present invention (referred to as the "device of the present invention" and "method of the present invention" occasionally hereinafter) will be described with reference to the drawings hereinafter.

First Embodiment

A process for forming a high-withstand voltage MOSFET and a low-withstand voltage MOSFET according to an aspect of the present invention to be mounted on the device of the present invention will be described with reference to sectional views in FIGS. 1 to 3. In addition, although a description will be made assuming that both high-withstand voltage MOSFET and low-withstand voltage MOSFET are an N channel type MOSFET in this embodiment to simplify the description, each of the high-withstand voltage MOSFET and the low-withstand voltage MOSFET can be a P channel type MOSFET by changing the kind of impurity.

Figure 1A:
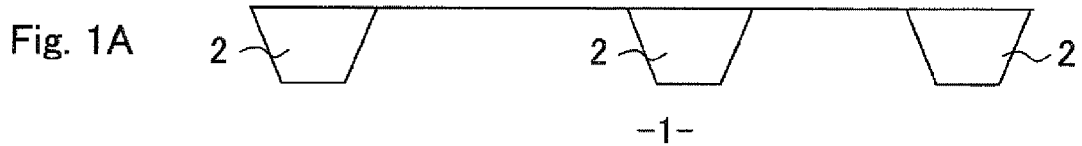
FIG. 1 is a process sectional view schematically showing a first process group of a manufacturing process in a first embodiment of a manufacturing method of a semiconductor device according to the present invention.

First, as shown in FIG. 1A, an element isolation region 2 having a depth of 0.3 to 1.0 μm is formed on a P type semiconductor substrate 1 using a well-known STI (Shallow Trench Isolation) technique. Thus, an active region separated by the element isolation region 2 is formed. In FIG. 1A, a left active region becomes an active region for a high withstand voltage in which the high-withstand voltage MOSFET is formed in a post-process, and a right active region becomes an active region for a low withstand voltage in which the low-withstand voltage MOSFET is formed in a post-process.

Figure 1B:
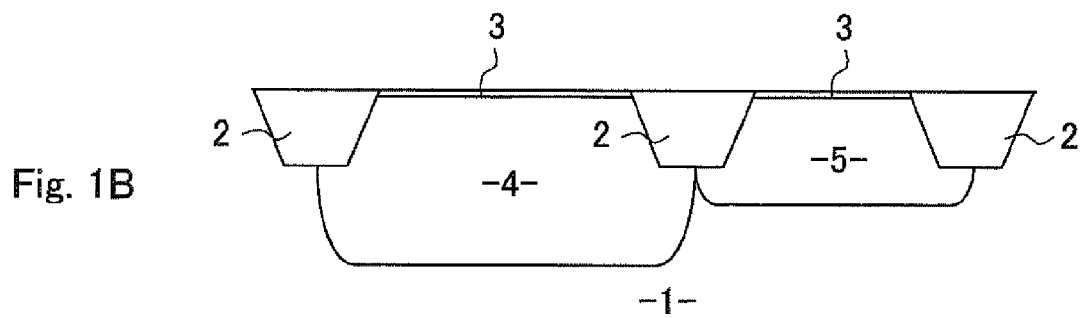

Next, as shown in FIG. 1B, a sacrifice oxide film 3 having a thickness of 10 to 30 nm is formed and then, a high-withstand voltage well region 4 (high-withstand voltage active region) and a low-withstand voltage well region 5 (low-withstand voltage active region) are formed by ion implantation of B (boron ion) as a P type impurity and by a heat treatment.

Figure 1C:
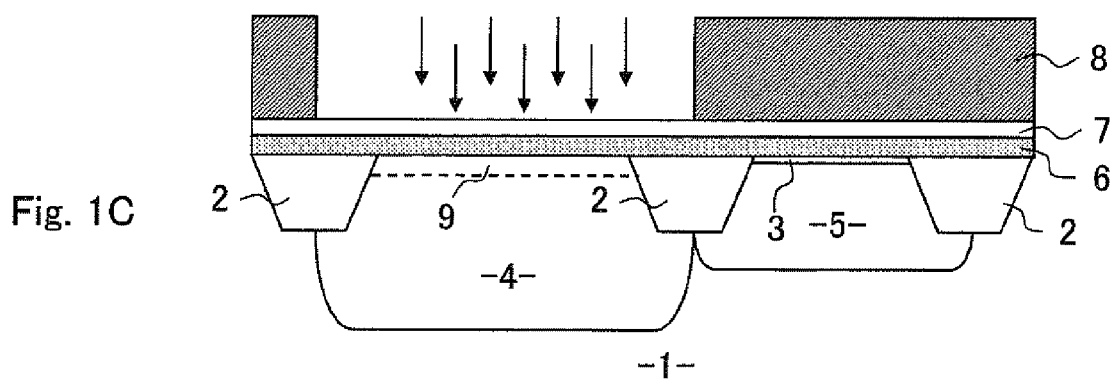

Next, as shown in FIG. 1C, only the sacrifice oxide film 3 in the high-withstand voltage well region 4 is removed and a first polysilicon film 6 having a thickness of 250 nm is deposited on the whole surface. Then, a polysilicon insulating cap oxide film 7 having a thickness of 100 nm is deposited by CVD method, and P (phosphorus ion), for example as an N type impurity is implanted using a resist mask 8 having an opening at the high-withstand voltage well region 4 only in two stages under two conditions such that at a dose of $5 \times 10^{12}$ ions/cm$^2$ at an energy of 100 keV and at a dose of $5 \times 10^{12}$ ions/cm$^2$ at an energy of 500 keV to form a drift region 9 for the high-withstand voltage MOSFET on the surface of the high-withstand voltage well region 4. At this time, the N type impurity is implanted and a drift layer is also formed in the first polysilicon film 6.

Figure 1D:
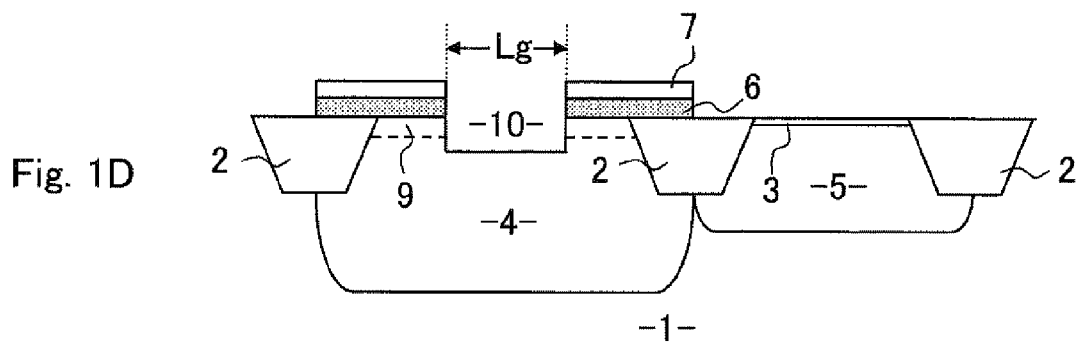

Then, as shown in FIG. 1D, the oxide film 7 and the first polysilicon film 6 on the low-withstand voltage well region 5 are removed and at the same time, one part of each of the oxide film 7 and the first polysilicon film 6 in the high-withstand voltage well region 4 and the drift region 9 on the surface of the high-withstand voltage well region 4 is removed by etching to form a trench portion 10 penetrating the above each layer, thereby exposing a lower part than the drift region 9 in the high-withstand voltage well region 4. The bottom surface of the trench portion 10 is positioned below the lower end of the drift region 9 and the depth thereof from the surface of the semiconductor substrate 1 is 300 to 900 nm, preferably 300 to 500 nm. In addition, a width Lg (lateral direction in FIG. 1D) of the trench portion 10 is formed within a range of 300 to 1200 nm. In addition, the width of the trench portion 10 corresponds to a gate length of the high-withstand voltage MOSFET. The gate length Lg (width of the trench portion 10) can be adjusted according to the usage of the high-withstand voltage MOSFET, and it is about 600 nm, for example in this embodiment.

Thus, a channel region is formed under the trench portion 10 and two drift regions 9 (corresponding to impurity diffusion drift layers) are formed on both sides of the trench portion 10 by self alignment. In addition, after the trench portion 10 has been formed, ion of B (boron) or P (phosphorus) may be implanted to the lower region of the trench portion 10 in order to control the threshold voltage of the high-withstand voltage MOSFET according to need.

In addition, it is to be noted that the oxide film 7 and the first polysilicon film 6 in the high-withstand voltage well region 4 are remained and extended to the upper part of the element isolation region 2.

Figure 1E:
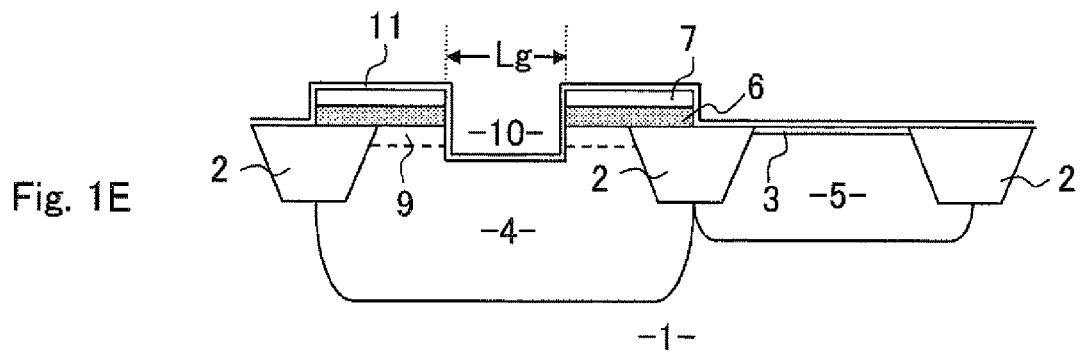

Next, as shown in FIG. 1E, in order to remove etching damage on the silicon layer, oxidation of 20 to 30 nm is performed at 850 to 950° C. in oxygen atmosphere and this oxidized film is removed and oxidation of 10 to 20 nm is performed at 850 to 950° C. in oxygen atmosphere again. Then, an oxide film having a thickness of 20 to 30 nm is deposited on the whole surface by CVD method, whereby a gate oxide film 11 for the high-withstand voltage MOSFET is formed.

Figure 2A:
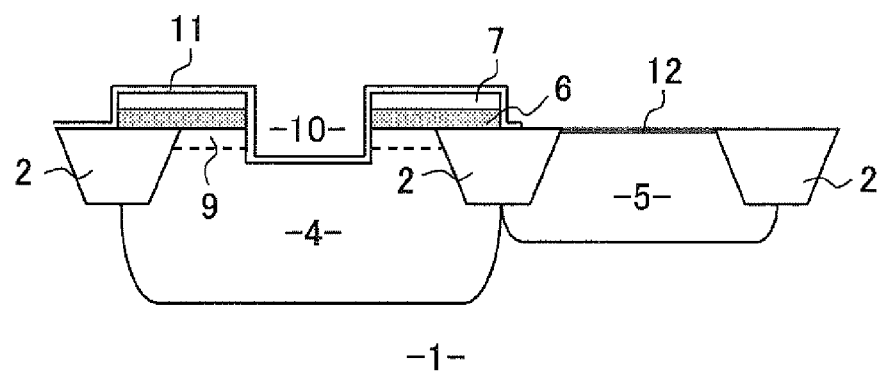
FIG. 2 is a process sectional view schematically showing a second process group of the manufacturing process in the first embodiment of the manufacturing method of the semiconductor device according to the present invention.

Next, as shown in FIG. 2A, the gate oxide 11 on the low-withstand voltage well region 5 is removed and oxidation of 5 to 7 nm is performed at 800 to 900° C. in oxygen atmosphere to form a gate oxide film 12 for the low-withstand voltage MOSFET.

Figure 2B:
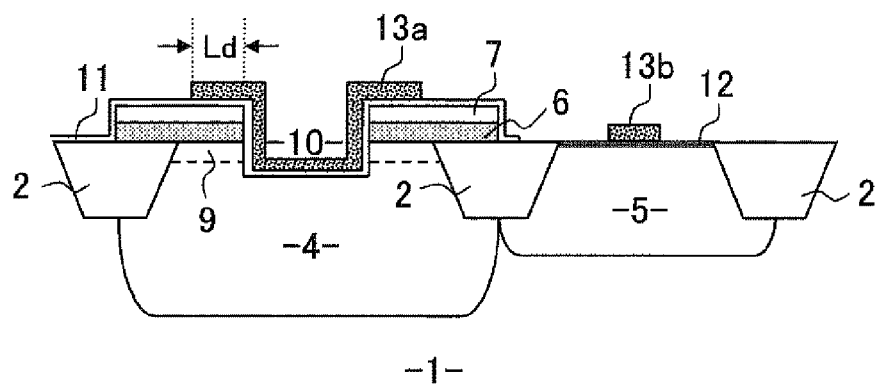

Then, as shown in FIG. 2B, a second polysilicon film 13 having a thickness of 250 nm, for example, to become gate electrodes 13a and 13b of the high-withstand voltage MOSFET and the low-withstand voltage MOSFET, respectively is deposited by CVD method and the second polysilicon film 13 is etched away using a predetermined resist pattern and each of the gate electrodes 13a and 13b is patterned. In addition, when a logic circuit to be mounted on the device of the present invention is formed, since the gate electrode 13b of the low-withstand voltage MOSFET capable of operating at high speed is also formed at the same time, the second polysilicon film 13 has a thickness of 150 to 350 nm and the gate electrodes 13a and 13b are patterned with the predetermined pattern at the same time.

Figure 6:
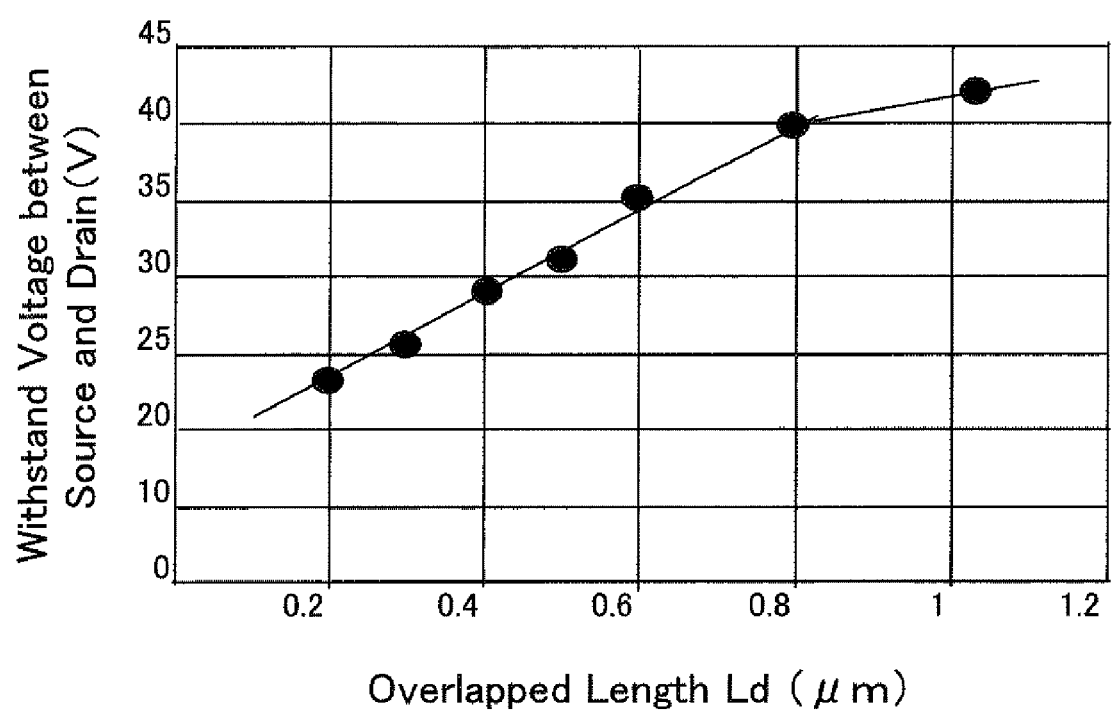
FIG. 6 is a graph showing one example of a relation between a withstand voltage between a source and a drain and an overlapped length of a gate electrode and a polysilicon drift region of a high-withstand voltage MOSFET of the semiconductor device according to the present invention.
Figure 7:
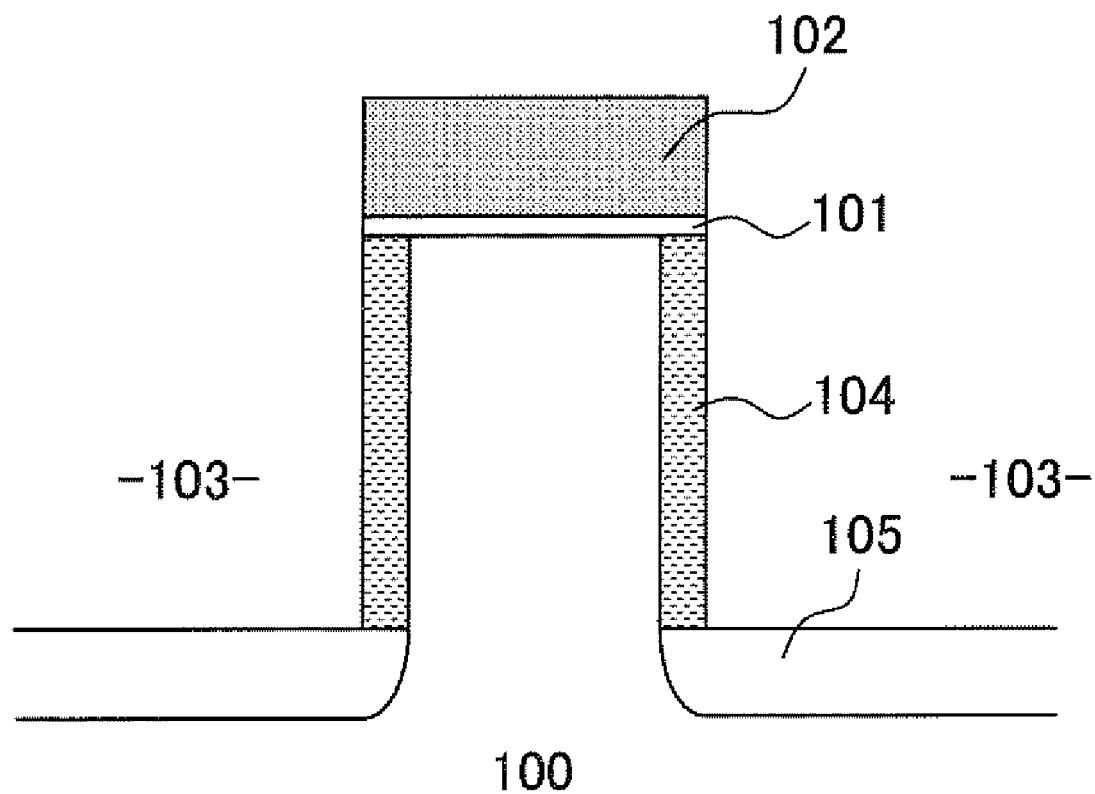
FIG. 7 is a sectional view schematically showing one example of an element structure of a conventional lateral type high-withstand voltage MOSFET.
Figure 8A:
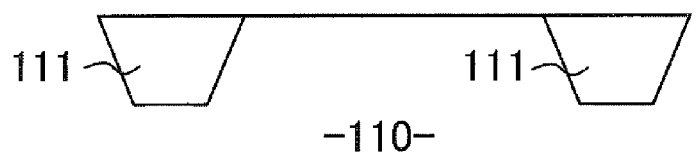
FIG. 8 is a process sectional view schematically showing a manufacturing process of a conventional trench gate type MOSFET.
Figure 8B:
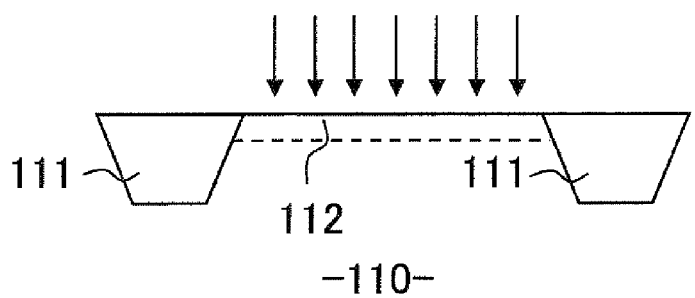
Figure 8C:
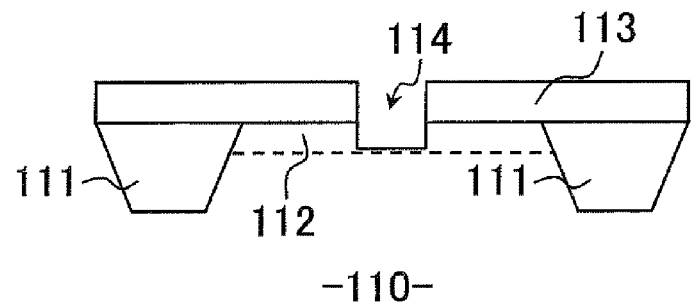
Figure 8D:
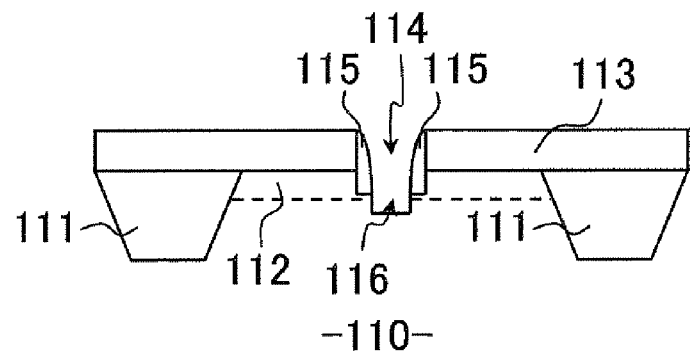
Figure 8E:
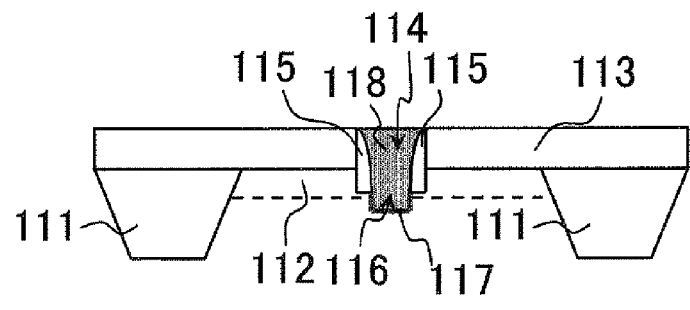

A region of the first polysilicon film 6 of the high-withstand voltage MOSFET overlapped with the gate electrode 13a (adjacent region on the side of the trench portion 10) becomes a drift layer in the first polysilicon film 6 eventually. Here, as shown in FIG. 6, a withstand voltage between the source and drain of the high-withstand voltage MOSFET varies depending on an overlapped length Ld (length of the adjacent region) between the first polysilicon film 6 and the gate electrode 13a. FIG. 6 shows a relation between the overlapped length Ld in a case where the gate length Lg is about 900 nm and the withstand voltage between the source and drain, and when the overlapped length Ld is within a range of 0.2 to 1 μm, 23 to 41V of a middle-withstand voltage between the source and drain can be provided. In addition, although it is not shown, when the overlapped length Ld is about 0.3 μm and the gate length Lg is within a range of 300 to 1200 nm, 10 to 25V of middle withstand voltage between the source and drain is provided. In addition, in order to prevent a withstand voltage between the drift layer (adjacent region) in the first polysilicon film 6 and the gate electrode 13a from deteriorating, the film thickness of the oxide film 7 therebetween (100 nm in this embodiment) is preferably set to about twice of the film thickness (20 to 30 nm in this embodiment) of the gate oxide film 11 of the high-withstand voltage MOSFET.

Figure 2C:
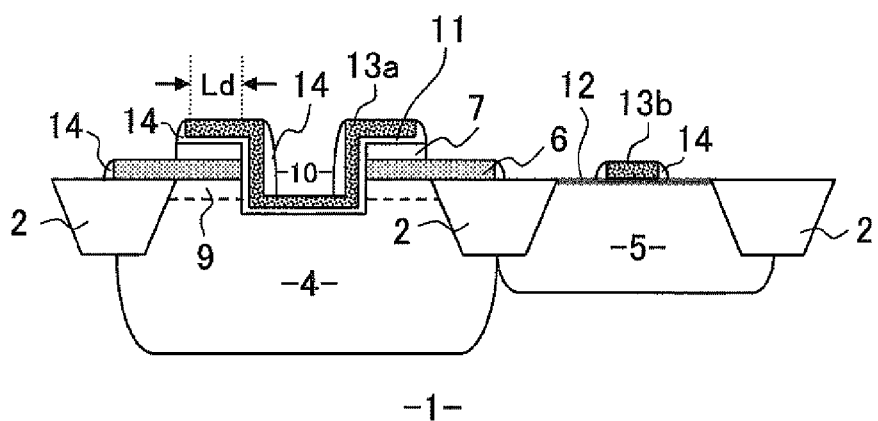

Next, as shown in FIG. 2C, an oxide film having a thickness of 100 nm to become sidewalls 14 of the gate electrodes 13a and 13b is deposited on the whole surface by CVD method and etch back is performed on the whole surface, whereby the sidewall 14 is formed.

Figure 2D:
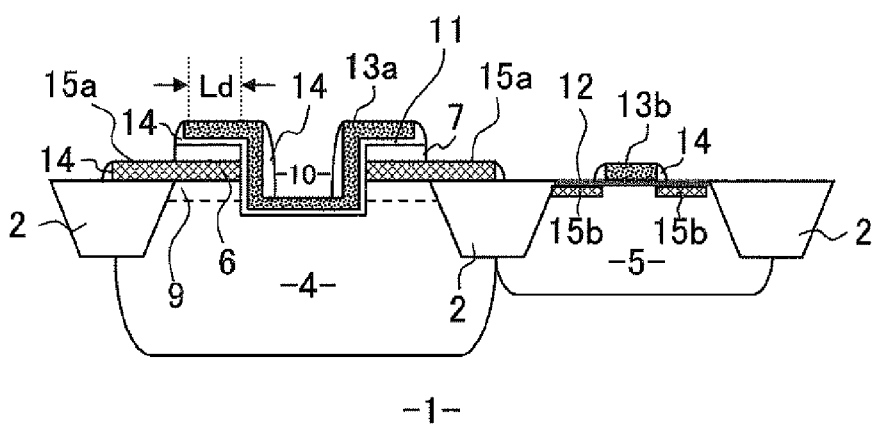

Then, as shown in FIG. 2D, As$^+$ (arsenic ion) for forming source and drain regions is implanted at a dose of $3\times10^{15}$ ions/cm$^2$ at energy of 40 keV with a predetermined pattern into the surface of the first polysilicon film 6 and the low-withstand voltage well region 5 and then, a heat treatment is performed by a RTA (Rapid Thermal Annealing) to activate the implanted N type impurity ion, whereby the source and drain regions 15a and 15b of the high-withstand voltage MOSFET and the low-withstand voltage MOSFET are formed, respectively.

Here, the source and drain regions 15a of the high-withstand voltage MOSFET are formed in a region of the first polysilicon film 6 not covered with the gate electrode 13a and the sidewall 14 other than the adjacent region and containing the region extended to the upper part of the element isolation region 2. In addition, the above adjacent region of the first polysilicon film 6 covered with the gate electrode 13a and the sidewall 14 serves as the drift region.

Figure 3A:
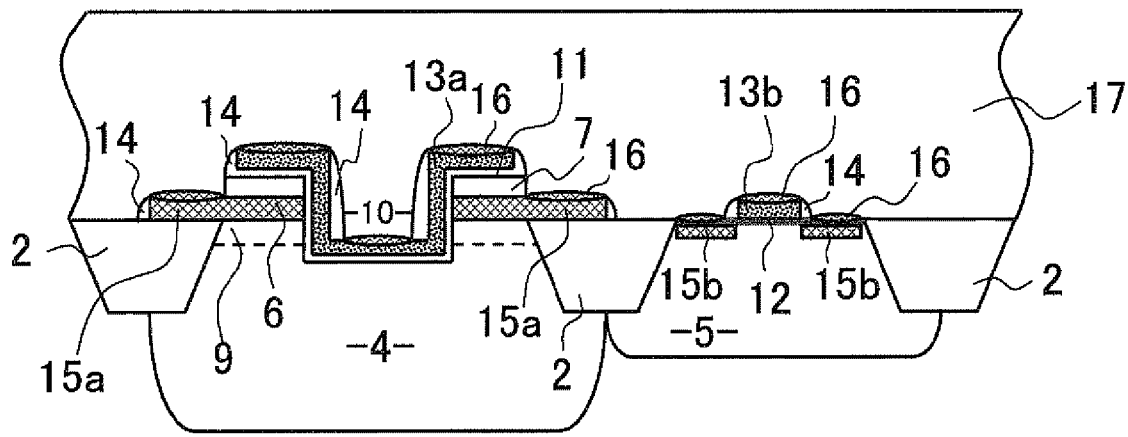
FIG. 3 is a process sectional view schematically showing a third process group of the manufacturing process in the first embodiment of the manufacturing method of the semiconductor device according to the present invention.

Next, as shown in FIG. 3A, a silicide layer 16 is formed on the upper surface of the gate electrodes 13a and 13b and the source and drain regions 15a and 15b of the high-withstand voltage MOSFET and the low-withstand voltage MOSFET, respectively, by a well-known technique, and an interlayer insulation film 17 (P—SiO, for example) having a thickness of 1 μm is deposited by CVD method and flattened by CMP (Chemical-Mechanical Polishing) method and the like.

Figure 3B:
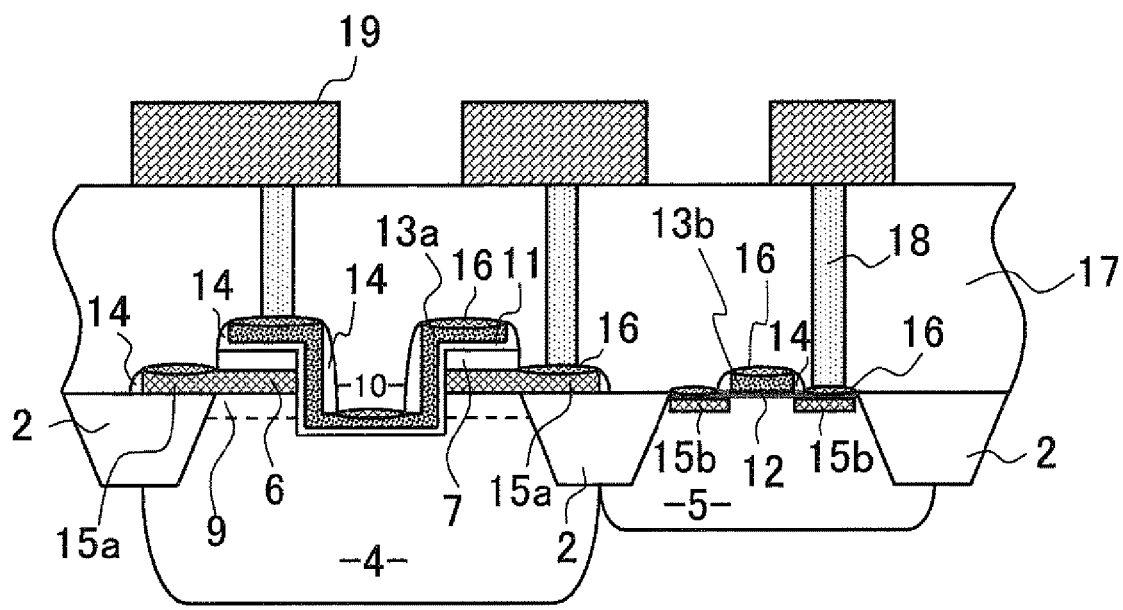

Then, as shown in FIG. 3B, a part of the interlayer insulation film 17 is opened to form a contact hole 18, and an electrode wiring 19 is formed on the interlayer insulation film 17 by a well-known technique so as to connect with the gate electrodes 13a and 13b and the source and drain regions 15a and 15b of each of the high-withstand voltage MOSFET and the low-withstand voltage MOSFET. In addition, in FIG. 3B, only the electrode wiring 19 for a part of the electrodes is representatively shown. In addition, since the process after the electrode wiring 19 has been formed process for forming a metal wiring and a protection film on the following upper layer, for example) is the same as a general semiconductor device, its detailed description will be omitted.

As described above, the device of the present invention comprising the N channel type high-withstand voltage MOSFET and low-withstand voltage MOSFET on the same P type semiconductor substrate is manufactured.

Second Embodiment

Next, a second embodiment of a process for forming a high-withstand voltage MOSFET and a low-withstand voltage MOSFET according to the present invention to be mounted on the device of the present invention will be described with reference to a sectional view in FIG. 4. In addition, although a description will be made assuming that both high-withstand voltage MOSFET and low-withstand voltage MOSFET are an N channel type MOSFET in this embodiment to simplify the description, each of the high-withstand voltage MOSFET and the low-withstand voltage MOSFET can be a P channel type MOSFET by changing the kind of impurity. In addition, common signs as those in the first embodiment are allotted to common parts.

Figure 4A:
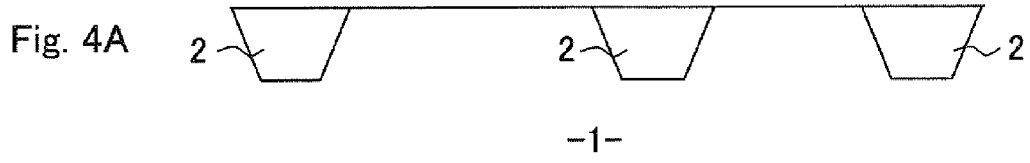
FIG. 4 is a process sectional view schematically showing a part of a process group of a manufacturing process in a second embodiment of the manufacturing method of the semiconductor device according to the present invention.

First, as shown in FIG. 4A, an element isolation region 2 having a depth of 0.3 to 1.0 μm is formed on a P type semiconductor substrate 1 by the well-known STI technique. Thus, an active region separated by the element isolation region 2 is formed. In FIG. 4A, a left active region becomes an active region for a high withstand voltage in which the high-withstand voltage MOSFET is formed in a post-process, and a right active region becomes an active region for a low withstand voltage in which the low-withstand voltage MOSFET is formed in a post-process.

Figure 4B:
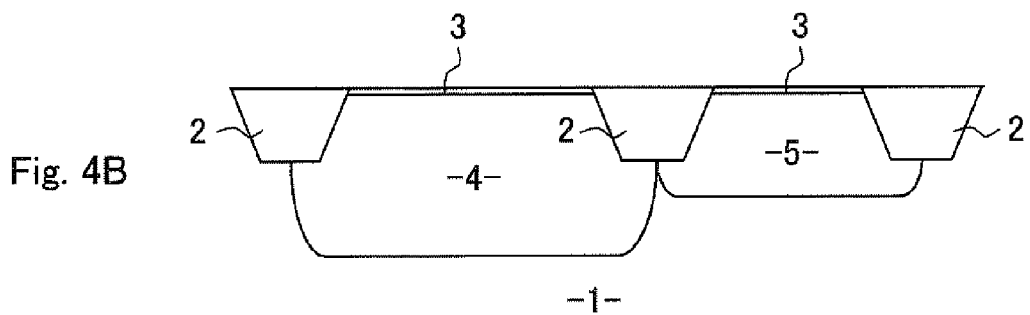

Next, as shown in FIG. 4B, a sacrifice oxide film 3 having a thickness of 10 to 30 nm is formed and then, a high-withstand voltage well region 4 (high-withstand voltage active region) and a low-withstand voltage well region 5 (low-withstand voltage active region) are formed by ion implantation of B (boron ion) as a P type impurity and by a heat treatment, respectively. The above processes are the same as those in the first embodiment.

Figure 4C:
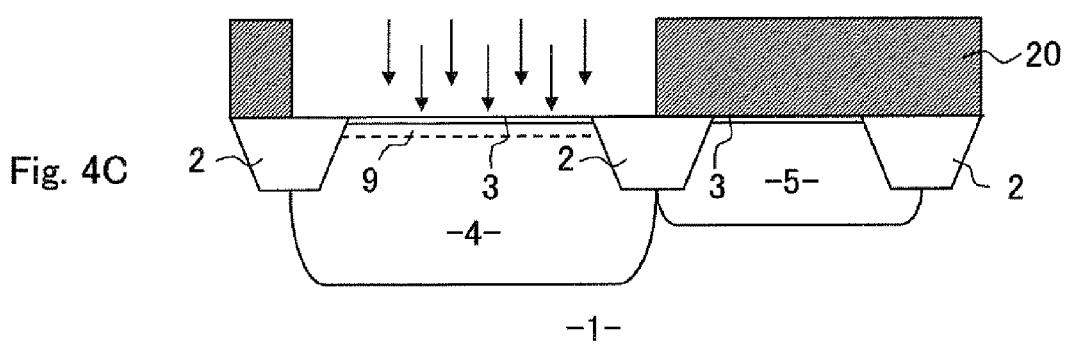

Next, as shown in FIG. 4C, in order to form a drift region for the high-withstand voltage MOSFET, P (phosphorus ion), for example, as an N type impurity is implanted at a dose of $5\times10^{12}$ ions/cm$^2$ at an energy of 100 keV using a resist mask 20 having an opening at the high-withstand voltage well region 4 only, whereby a drift region 9 for the high-withstand voltage MOSFET is formed on the high-withstand voltage well region 4.

Figure 4D:
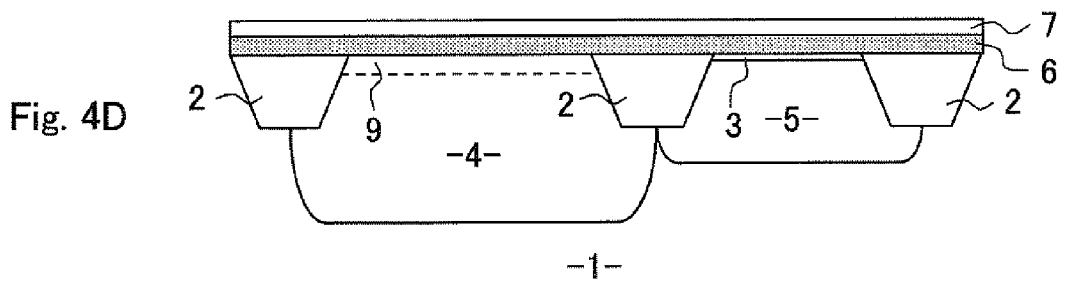

Then, as shown in FIG. 4D, only the sacrifice oxide film 3 in the high-withstand voltage well region 4 is removed and a first polysilicon film 6 having a thickness of 250 nm is deposited on the whole surface. Then, a polysilicon insulating cap oxide film 7 having a thickness of 100 nm is deposited by CVD method.

According to the second embodiment, since the ion implantation to form the drift region 9 is performed before the first polysilicon film 6 is deposited, an N type impurity is not previously implanted in the first polysilicon film 6 unlike the first embodiment.

Figure 4E:
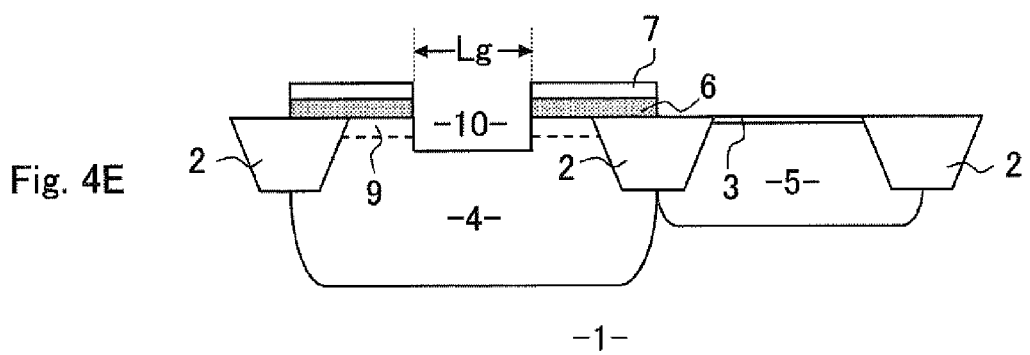

Then, as shown in FIG. 4E, the oxide film 7 and the first polysilicon film 6 on the low-withstand voltage well region 5 are removed and at the same time, one part of each of the oxide film 7 and the first polysilicon film 6 in the high-withstand voltage well region 4 and the drift region 9 on the surface of the high-withstand voltage well region 4 is removed by etching to open a trench portion 10 penetrating the above each layer, thereby exposing a lower part than the drift region 9 in the high-withstand voltage well region 4. Since a depth of the trench portion 10 and a width Lg of the trench portion 10 (lateral direction in FIG. 4E) are the same as those in the first embodiment, their description will be omitted.

After the trench portion 10 has been opened, the same processes as in the first embodiment (refer to FIGS. 2A to 2D) are performed to sequentially form a gate oxide film 12 for the low-withstand voltage MOSFET, gate electrodes 13a and 13b and source and drain regions of the high-withstand voltage MOSFET and the low-withstand voltage MOSFET, respectively. Then, the same processes as those in the first embodiment (refer to FIGS. 3A and 3B) are performed to deposit and flatten an interlayer insulation film 17, form a contact hole 18 and an electrode wiring 19, whereby the device of the present invention comprising the N channel type high-withstand voltage MOSFET and the low-withstand voltage MOSFET on the same P type semiconductor substrate is provided similar to the first embodiment.

Here, as shown in FIG. 2D, in the process to form the source and drain regions 15a and 15b of the high-withstand voltage MOSFET and the low-withstand voltage MOSFET, respectively by implanting As$^+$ (arsenic ion) for the source and drain regions at a dose of $3\times10^{15}$ ions/cm$^2$ at energy of 40 keV with a predetermined pattern into the surface of the first polysilicon film 6 and the low-withstand voltage well region 5 and then, performing the heat treatment by the RTA (Rapid Thermal Annealing) method to activate the implanted N type impurity ion, since the drift region is formed in the above adjacent region of the first polysilicon film 6 covered with the gate electrode 13a and the sidewall 14 because of diffusion of the implanted source and drain in the lateral direction, the overlapped length Ld (length of the adjacent region) of the first polysilicon film 6 and the gate electrode 13a cannot be so long as that in the first embodiment, so that it is limited within a range of 0.2 to 0.3 μm. In this case, the withstand voltage between the source and drain is limited to be lower than that of the first embodiment, that is, 10 to 25 V.

Third Embodiment

Figure 5:
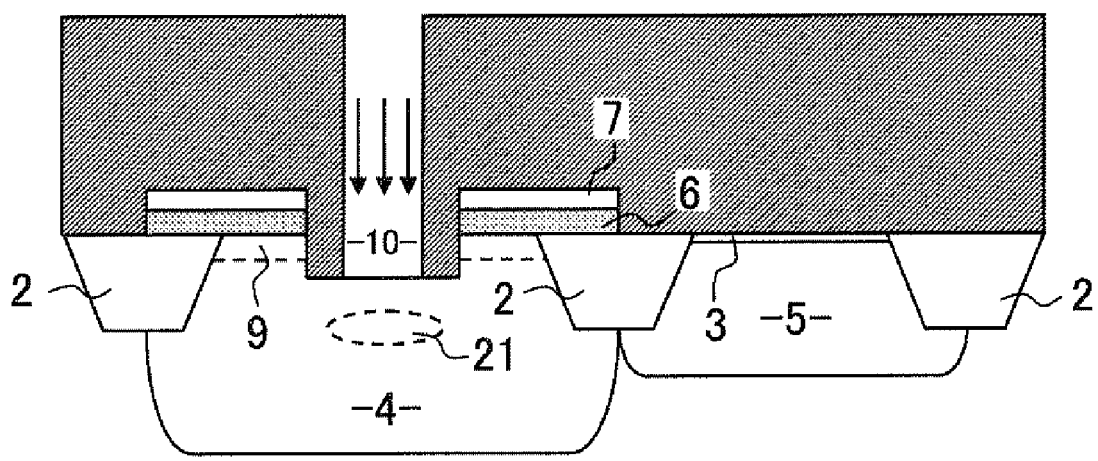
FIG. 5 is a process sectional view schematically showing a part of an additional step of a manufacturing process in a third embodiment of the manufacturing method of the semiconductor device according to the present invention.

A third embodiment of a process for forming a high-withstand voltage MOSFET and a low-withstand voltage MOSFET to be mounted on the device of the present invention according to the method of the present invention will be described with reference to a sectional view in FIG. 5. According to the third embodiment, after the trench portion 10 has been formed, a process for forming a channel stopper region 21 under the bottom surface of the trench portion 10 in the high-withstand voltage well region 4 is added to the process for forming the high-withstand voltage MOSFET in the first embodiment.

Since the steps until the trench portion 10 is formed (FIGS. 1A to 1D) are the same as those in the first embodiment, their description will be omitted. After the trench portion 10 has been formed through the same processes as those in the first embodiment, as shown in FIG. 5, B (boron ion), for example, as a P type impurity is implanted at a dose of 2 to $4\times10^{12}$ ions/cm$^2$ at an energy of 60 to 100 keV, whereby the channel stopper region 21 is formed. This channel stopper region 21 prevents a short channel effect for the high-withstand voltage MOSFET.

After the channel stopper region 21 has been formed, the steps (FIGS. 1E to 3B) after the trench portion 10 has been formed in the first embodiment are performed, whereby the device of the present invention comprising the N channel type high-withstand voltage MOSFET and the low-withstand voltage MOSFET on the same P type semiconductor substrate is provided similar to the first embodiment.

In addition, the process for forming the channel stopper region 21 added in the third embodiment may be applied to the second embodiment and in this case, it may be added after the trench portion 10 has been formed similarly.

Fourth Embodiment

A fourth embodiment of a process for forming a high-withstand voltage MOSFET and a low-withstand voltage MOSFET to be mounted on the device of the present invention according to the method of the present invention will be described with reference to a sectional view in FIG. 9. According to the fourth embodiment, after the trench portion 10 has been formed, a process for forming channel stopper regions 23 (corresponding to second channel stopper regions) under the bottom surface of the trench portion 10 and under the drift region 9 in the high-withstand voltage well region 4 is added to the process for forming the high-withstand voltage MOSFET in the first embodiment.

Figure 9A:
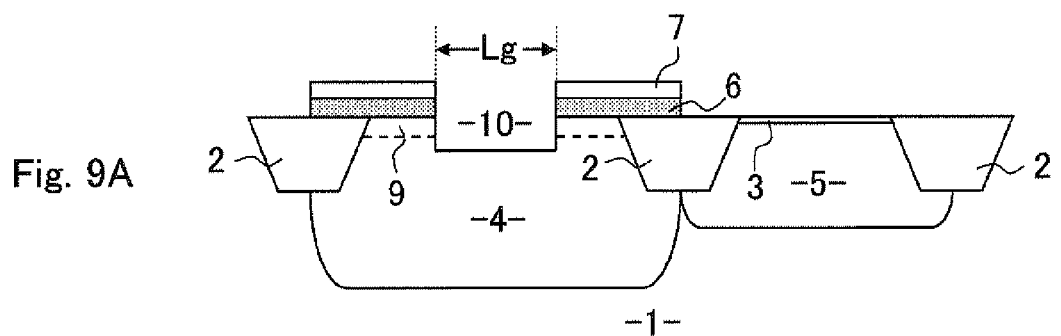
FIG. 9 is a process sectional view schematically showing a part of an additional process and its previous and next processes of a manufacturing process in a fourth embodiment of the manufacturing method of the semiconductor device according to the present invention.
Figure 9B:
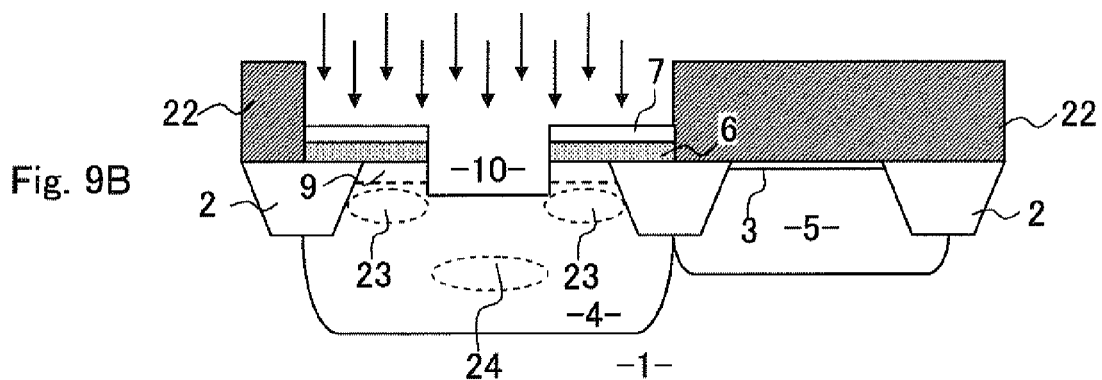

Processes until the trench portion 10 is formed are the same as those (FIGS. 1A to 1D) until the trench portion 10 is formed in the first embodiment. After the trench portion 10 has been formed as shown in FIG. 9A, as shown in FIG. 9B, B (boron ion), for example, as a P type impurity is implanted at a dose of 2 to $4\times10^{12}$ ions/cm$^2$ at an energy of 60 to 100 keV in the whole high-withstand voltage MOSFET region using a resist mask 22, whereby the channel stopper region 23 is formed under the drift region 9. This channel stopper region 23 prevents a short channel effect of the high-withstand voltage MOSFET, so that the high-withstand voltage MOSFET can be reduced in size.

Figure 9C:
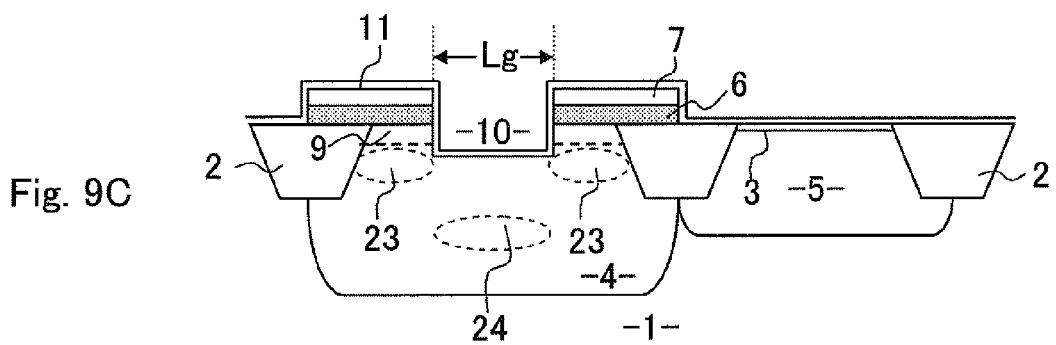

After the channel stopper region 23 has been formed, the processes (FIG. 1E, FIGS. 2A to 2D and FIGS. 3A to 3B) after the trench portion 10 has been formed in the first embodiment are performed, whereby the device of the present invention comprising the N channel type high-withstand voltage MOSFET and the low-withstand voltage MOSFET on the same P type semiconductor substrate is provided similar to the first embodiment. FIG. 9C shows a sectional structure provided by performing the same series of processes from the time when the trench portion 10 is formed until the gate oxide film 11 is formed in the first embodiment after the channel stopper region 23 has been formed.

Figure 10:
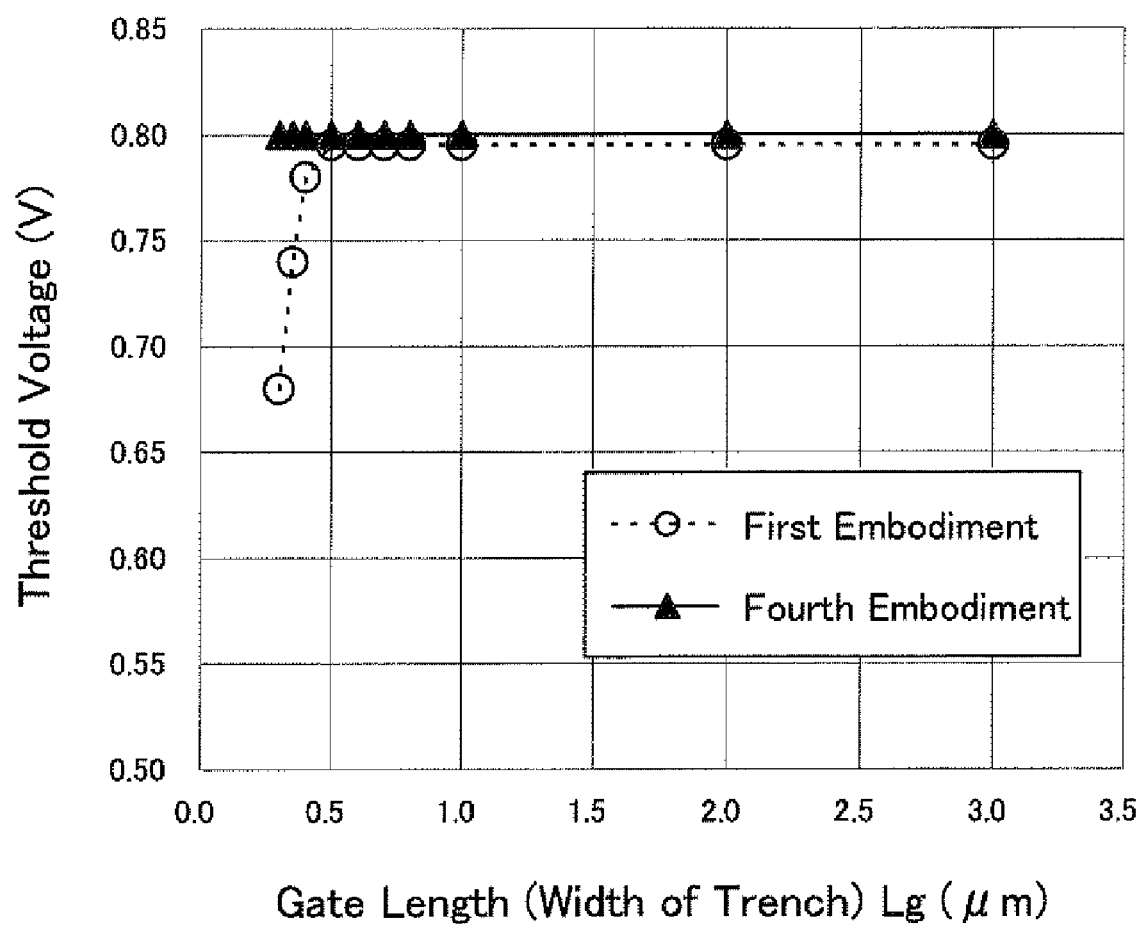
FIG. 10 is a graph showing one example of a relation between a gate length (width of a trench) and a threshold voltage in the fourth embodiment of the manufacturing method of the semiconductor device according to the present invention.

FIG. 10 shows one example of a relation between the gate length Lg (width of the trench portion 10) and the threshold voltage of the high-withstand voltage MOSFET manufactured as described above. Here, in forming the channel stopper region 23, the ion implantation was performed such that B (boron ion) was implanted at a dose of $3\times10^{12}$ ions/cm$^2$ at energy of 80 keV. As compared with the first embodiment having no channel stopper region, according to the fourth embodiment, even in the region where the gate length Lg is short (region of 0.4 μm or less in the example shown in FIG. 10), the threshold voltage is not lowered, whereby the short channel effect is prevented and its manufacturing cost is reduced because of the reduction in size of the high-withstand voltage MOSFET.

Although the channel stopper region 23 can be formed by ion implantation using a special resist mask having an opening only at the drift region 9 of the high-withstand voltage MOSFET, when the ion implantation process for forming the channel stopper region 23 is performed between the process for forming the trench portion 10 and the process for depositing the gate electrode 13a for the high-withstand voltage MOSFET, it can be formed by self alignment without using the special resist mask. For example, the channel stopper region 23 may be formed after the gate oxide film 11 has been formed.

When the ion implantation of the P type impurity is performed to form the channel stopper region 23 in the whole high-withstand voltage MOSFET region after the trench portion 10 has been formed, although a P type impurity ion implantation region 24 is formed under the bottom surface of the trench portion 10 also, since the impurity ion implantation region 24 is formed deeper by a depth from the surface of the high-withstand voltage active region to the bottom of the trench portion 10, it does not affect the electric characteristics such as the threshold voltage of the high-withstand voltage MOSFET, so that the channel stopper region 23 is formed only under the drift region 9 by self alignment.

Since the resist mask used in forming the channel stopper region 23 can be the same as that used in forming the high-withstand voltage MOSFET well region 4, it is not necessary to prepare a special photomask for forming the channel stopper region 23, so that the cost for the photomask can be cut.

In addition, the process for forming the channel stopper region 23 added in the fourth embodiment can be applied to the second and third embodiments and in this case, the process for forming the channel stopper region 23 may be added between the process for forming the trench portion 10 and the process for depositing the gate electrode 13a for the high-withstand voltage MOSFET similarly. In addition, when the process for the channel stopper region 23 is added to the third embodiment, it may be added before or after the process for forming the channel stopper region 21.

Figure 11A:
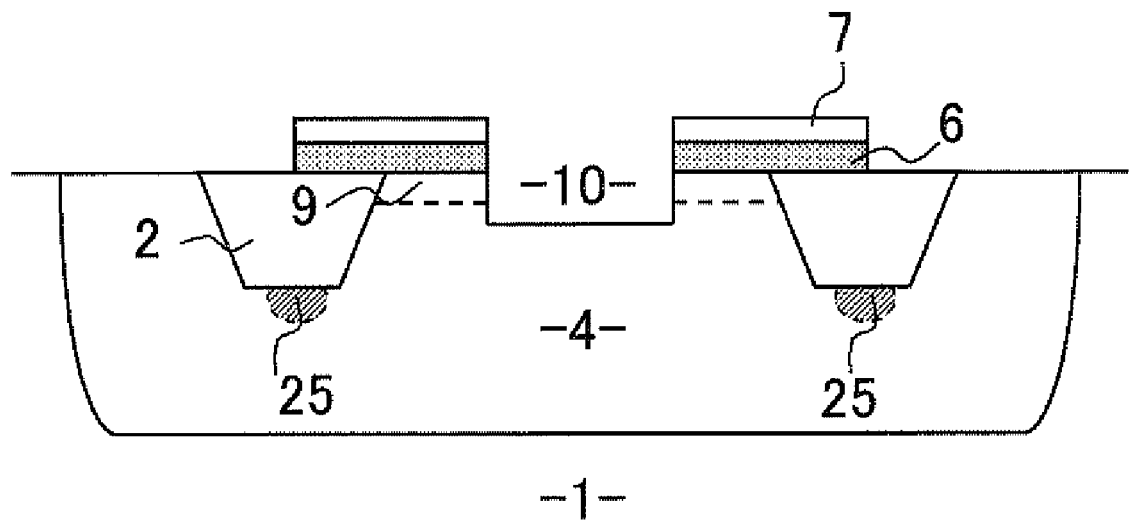
FIG. 11 is a process sectional view schematically showing another embodiment in which a channel stopper region is formed at a lower region of an impurity diffusion drift layer in the fourth embodiment of the manufacturing method of the semiconductor device according to the present invention.
Figure 11B:
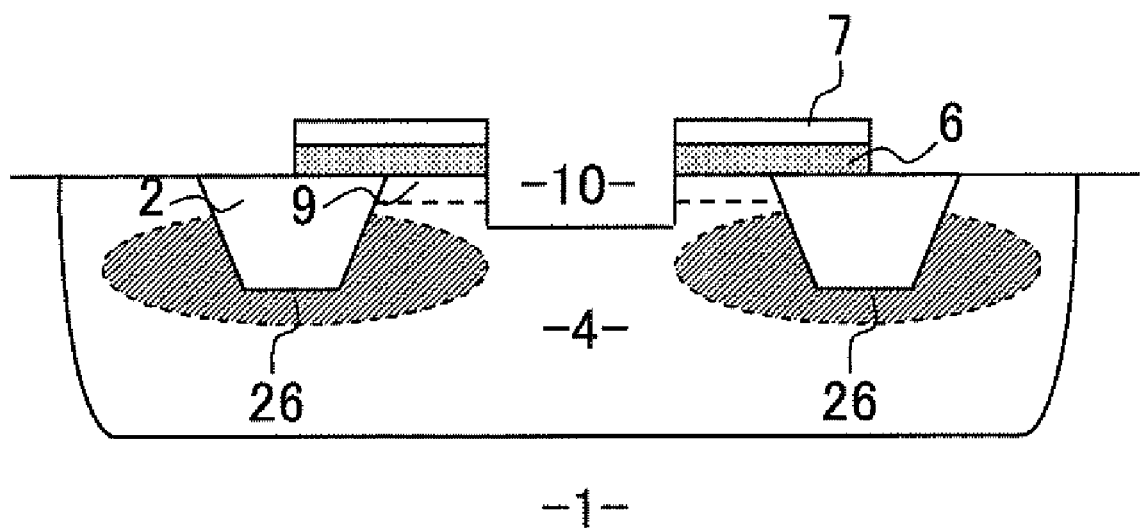
Figure 12A:
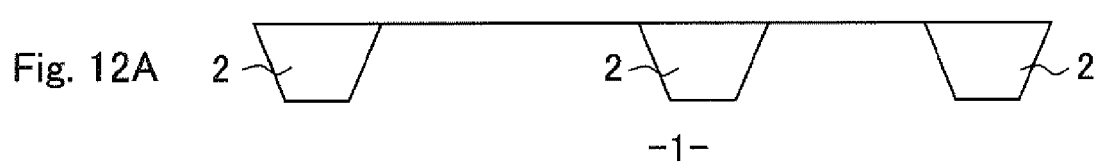
FIG. 12 is a process sectional view schematically showing a part of a process group of a manufacturing process in a fifth embodiment of the manufacturing method of the semiconductor device according to the present invention.
Figure 12B:
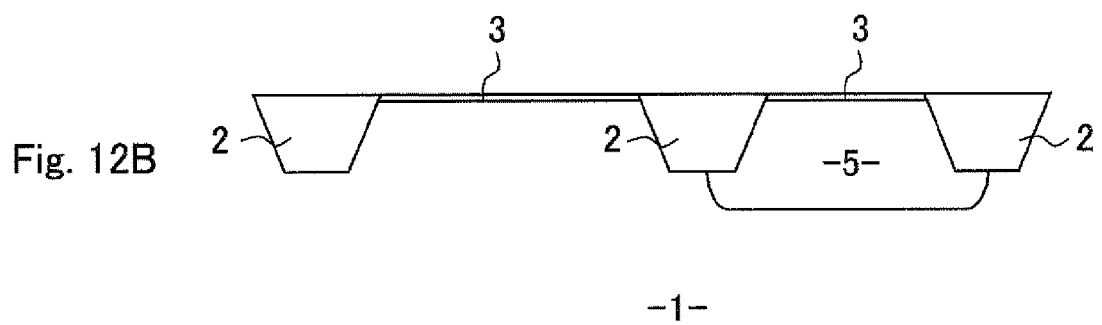
Figure 12C:
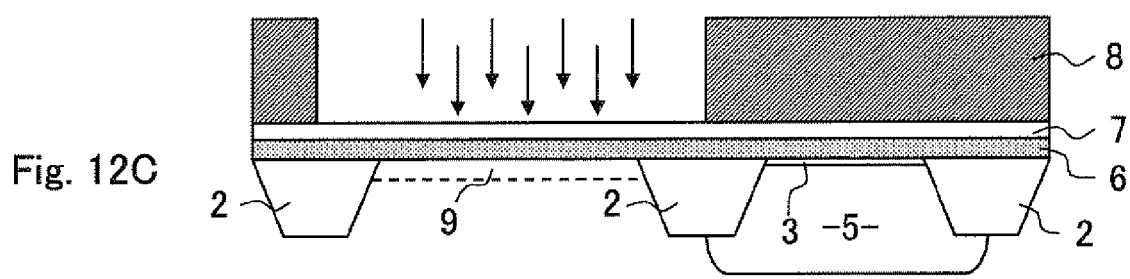
Figure 12D:
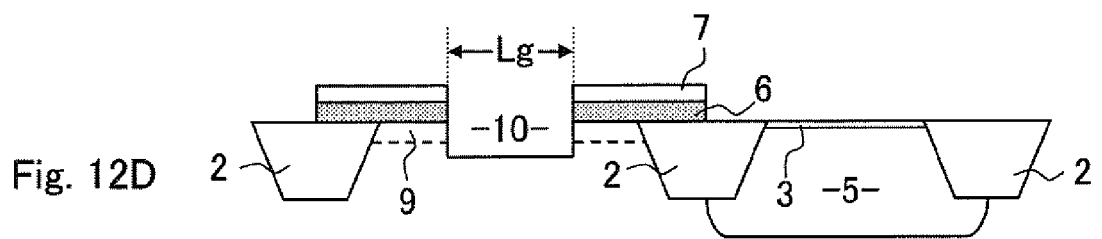

In addition, although the channel stopper region 23 is formed by ion implantation of the P type impurity in the fourth embodiment, a third channel stopper region 26 may be formed, instead of the above ion implantation, as shown in FIG. 11 in such a manner that in the process for forming the element isolation region 2, a heat treatment is carried out after the trench portion 10 has been formed on the inversion prevention implantation region 25 that was formed under the element isolation region 2 by ion implantation of P type impurity to thermally diffuse the P type impurity of the inversion prevention implantation region 25 to the lower part of the drift region 9 so as to combine the inversion prevention implantation region 25 and the channel stopper region 23.

Fifth Embodiment

A fifth embodiment of a process for forming a high-withstand voltage MOSFET and a low-withstand voltage MOSFET to be mounted on the device of the present invention according to the method of the present invention will be described with reference to sectional views in FIGS. 12 and 13. According to the fifth embodiment, the process for forming the high-withstand voltage well region 4 by ion implantation is performed after the trench portion 10 has been formed instead of being performed after the element isolation region 2 has been formed, in the process for forming the high-withstand voltage MOSFET in the first embodiment.

Figure 13A:
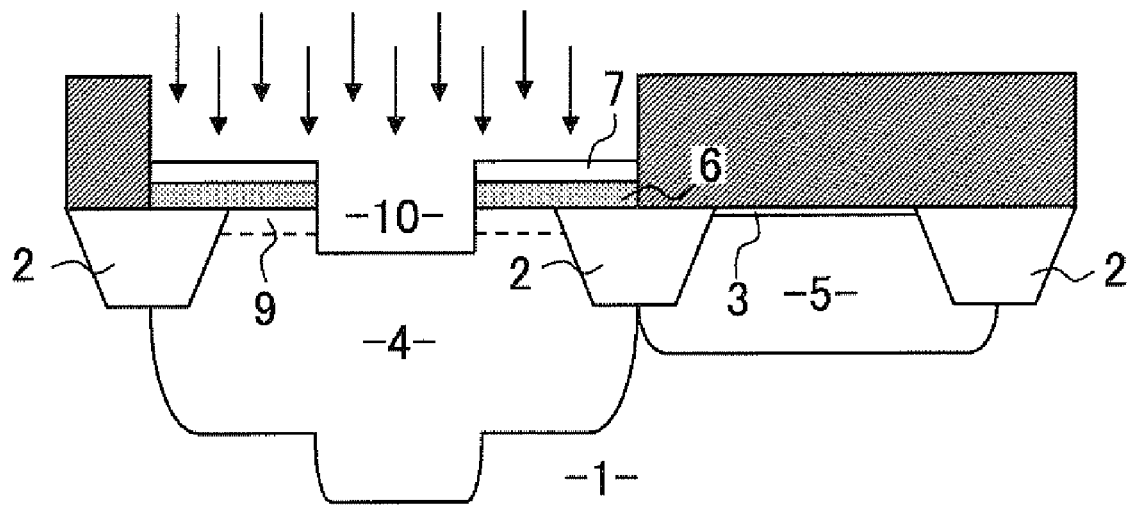
FIG. 13 is a process sectional view schematically showing a part of an additional process and its next process of the manufacturing process in the fifth embodiment of the manufacturing method of the semiconductor device according to the present invention.

The processes until the trench portion 10 is formed are carried out on an active region that will become a high-withstand voltage well region 4 in the same manner as the processes (FIGS. 1A to 1D) until the trench portion 10 is formed in the first embodiment except for removing the ion implantation process for forming the high-withstand voltage well region 4. FIGS. 12A to 12D show the sectional structures until the trench portion 10 is formed. Then, as shown in FIG. 13A, ion implantation is carried out to form the high-withstand voltage well region 4. At this time, the implantation for controlling the threshold voltage of the high-withstand voltage MOSFET is performed with B (boron ion) at a dose of $2\times10^{12}$ ions/cm$^2$ at energy of 30 keV.

Although in the case of the first embodiment, it is difficult to keep the threshold voltage of the high-withstand voltage MOSFET stable because it is affected by the variation in depth of the trench portion 10 (because the impurity concentration distribution in a depth direction of the high-withstand voltage well region is not flat), according to the fifth embodiment, since the impurity concentration distribution from the bottom surface of the trench portion 10 in the depth direction can be kept constant regardless of the variation in depth of the trench portion 10, the variation in threshold voltage of the high-withstand voltage MOSFET can be suppressed.

Figure 13B:
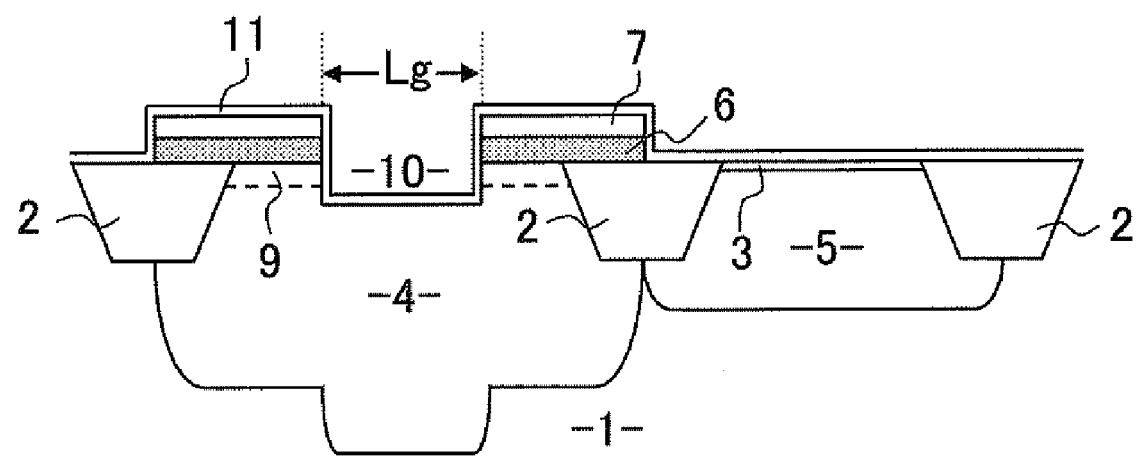

After the high-withstand voltage well region 4 has been formed, the same processes as those in the first embodiment after the trench portion 10 has been formed (FIGS. 1E, 2A to 2D, and 3A to 3B) are performed, whereby the device of the present invention comprising the N channel type high-withstand voltage MOSFET and the low-withstand voltage MOSFET on the same P type semiconductor substrate 1 is manufactured similar to the first embodiment. FIG. 13B shows a sectional structure provided by performing the same series of processes from the time when the trench portion 10 is formed until the gate oxide film 11 is formed in the first embodiment after the high-withstand voltage well region 4 has been formed.

In addition, when the process for forming the high-withstand voltage well region 4 is performed between the process for forming the trench portion 10 and the process for depositing the gate electrode 13a for the high-withstand voltage MOSFET, the variation in threshold voltage of the high-withstand voltage MOSFET can be suppressed similar to the above. For example, the high-withstand voltage well region 4 may be formed after the gate oxide film 11 has been formed.

Figure 14:
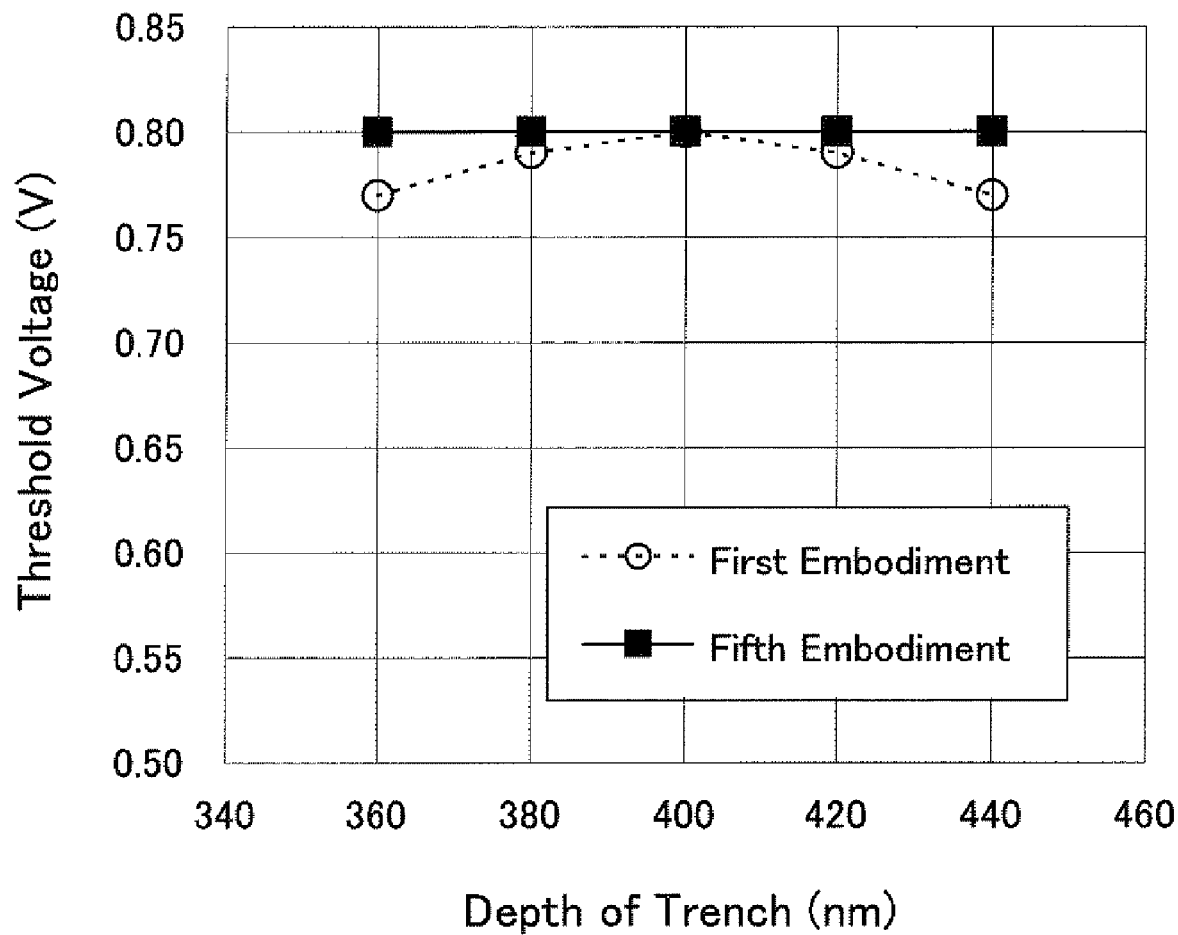
FIG. 14 is a graph showing one example of a relation between a depth of a trench and a threshold voltage in the fifth embodiment of a high-withstand voltage MOSFET of the semiconductor device according to the present invention.

FIG. 14 shows an example of a relation between the depth of the trench portion 10 and the threshold voltage of the high-withstand voltage MOSFET manufactured as described above. Although the threshold voltage slightly fluctuates when the depth of the trench portion fluctuates in the case of the first embodiment, the threshold voltage hardly fluctuates in the case of the fifth embodiment. That is, the fifth embodiment is preferable because the variation in threshold voltage caused by the variation in depth of the trench portion 10 can be suppressed.

In addition, the process for forming the high-withstand voltage well region 4 in the fifth embodiment can be applied to the second and fourth embodiments and in this case, the high-withstand voltage well region 4 may be formed after the trench portion 10 has been formed. Especially; when the process for forming the high-withstand voltage well region 4 in the fifth embodiment is applied to the fourth embodiment, the ion implantation for forming the channel stopper region 23 in the fourth embodiment can be performed at the time of the ion implantation for forming the high-withstand voltage well region 4 in the fifth embodiment, so that the process can be simplified and the manufacturing cost can be reduced.

Another Embodiment

Next, another embodiment of the device of the present invention and the method of the present invention will be described.

A description has been made of the device of the present invention on which the high-withstand voltage MOSFET and the low-withstand voltage MOSFET are mounted and its manufacturing method in detail in the above embodiments. Although the device and method of the present invention is characterized in structure in which the short channel effect of the high-withstand voltage MOSFET is suppressed and the element can be reduced in size, structure in which both high-withstand voltage MOSFET and low-withstand voltage MOSFET can be easily mounted, and their forming method, it is not always necessary to mount the low-withstand voltage MOSFET.

In addition, although the specific examples of the dimension of each part and the conditions of the ion implantation and oxidation and the like are shown in the above each embodiment, the device and method of the present invention is not limited to the above specific numeric values.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor device comprising:
    an element isolation region;
    an active region separated by the element isolation region; and
    a high-withstand voltage MOSFET formed in a high-withstand voltage active region of at least one section of the active region on a semiconductor substrate, wherein
    the high-withstand voltage MOSFET comprises
        a trench portion formed at the high-withstand voltage active region of a first conductivity type,
        two polysilicon layers formed on the high-withstand voltage active region on both sides of the trench portion by implanting an impurity of a second conductivity type opposite to the first conductivity type,
        two impurity diffusion drift layers positioned on the both sides of the trench portion and formed by implanting an impurity of the second conductivity in a surface of the high-withstand voltage active region under the polysilicon layers, and
        a gate electrode formed through a gate oxide film on bottom and side surfaces of the trench portion and an end surface facing the trench portion and an upper surface of an adjacent region of each of the polysilicon layers, the adjacent region being a part of the polysilicon layer close to the trench portion, and
        a source region and a drain region are formed in parts of the two polysilicon layers not covered with the gate electrode other than the adjacent regions.

2. The semiconductor device according to claim 1, wherein the trench portion has a depth from the surface of the high-withstand voltage active region deeper than that of the impurity diffusion drift layer.

3. The semiconductor device according to claim 1, wherein the depth of the trench portion from the surface of the high-withstand voltage active region is within a range of 300 to 900 nm.

4. The semiconductor device according to claim 1, wherein a gate length defined by a width of the trench portion between the two polysilicon layers is within a range of 300 to 1200 nm.

5. The semiconductor device according to claim 1, wherein at least one of the two polysilicon layers is formed so as to be extended from an upper surface of the active region to an upper surface of the element isolation region.

6. The semiconductor device according to claim 5, wherein the source region or the drain region is formed in the polysilicon layer above the element isolation region.

7. The semiconductor device according to claim 1, wherein
    a length of the adjacent region of each of the two polysilicon layers in a direction away from the trench portion is within a range of 200 to 1000 nm, and
    a withstand voltage of the high-withstand voltage MOSFET is adjusted within a range of 10 to 40 V according to the length of the adjacent region.

8. The semiconductor device according to claim 1, wherein a silicide film is formed on upper surfaces of the source region and the drain region of the two polysilicon layers and the upper surface of the gate electrode.

9. The semiconductor device according to claim 1, wherein a low-withstand voltage MOSFET is formed at another section of the active region in which the high-withstand voltage MOSFET is not formed.

10. A method of manufacturing the semiconductor device, the method comprising:
    forming an element isolation region;
    forming an active region separated by the element isolation region; and
    forming a high-withstand voltage MOSFET in a high-withstand voltage active region of at least one section of the active region on a semiconductor substrate,
    wherein the step for forming the high-withstand voltage MOSFET comprises:
        forming the element isolation region on the semiconductor substrate;
        forming the high-withstand voltage active region of a first conductivity type in at least one section of the active region;
        forming a polysilicon film and a first oxide film on an upper surface of the high-withstand voltage active region;
    implanting an impurity ion of a second conductivity type in the polysilicon film and the surface of the high-withstand voltage active region through the first oxide film, the second conductivity type being opposite to the first conductivity type;
        forming a trench portion penetrating the first oxide film, the polysilicon film and a surface part of the impurity ion-implanted high-withstand voltage active region and having an opening at an upper side so as to form two polysilicon layers one on each side of the trench portion;
        depositing a gate oxide film and a gate electrode material film on side and bottom surfaces of the trench portion and an upper surface of the first oxide film;
        forming a gate electrode by patterning the gate electrode material film; and
        forming a source region and a drain region by implanting an impurity ion of the second conductivity type in parts of the two polysilicon layers not covered with the gate electrode.

11. A method of manufacturing the semiconductor device, the method comprising:
    forming an element isolation region;
    forming an active region separated by the element isolation region; and
    forming a high-withstand voltage MOSFET in a high-withstand voltage active region of at least one section of the active region on a semiconductor substrate,
    wherein the step for forming the high-withstand voltage MOSFET comprises:

forming the element isolation region on the semiconductor substrate;

forming the high-withstand voltage active region of a first conductivity type in at least one section of the active region;

implanting an impurity ion of a second conductivity type in a surface of the high-withstand voltage active region, the second conductivity type being opposite to the first conductivity type;

forming a polysilicon film and a first oxide film on an upper surface of the impurity ion-implanted high-withstand voltage active region;

forming a trench portion penetrating the first oxide film, the polysilicon film and the surface part of the impurity ion-implanted high-withstand voltage active region and having an opening at an upper side so as to form two polysilicon layers one on each side of the trench portion;

depositing a gate oxide film and a gate electrode material film on side and bottom surfaces of the trench portion and an upper surface of the first oxide film;

forming a gate electrode by patterning the gate electrode material film; and forming a source region and a drain region by implanting an impurity ion of the second conductivity type in parts of the two polysilicon layers not covered with the gate electrode.

12. The method of manufacturing the semiconductor device according to claim 10, further comprising:

forming a channel stopper region by implanting an impurity ion of the first conductivity type, the channel stopper region being formed in an inner region of the high-withstand voltage active region under a bottom of the trench portion, wherein the step of forming the channel stopper region is performed between the step of forming the trench portion, and the step of depositing the gate oxide film and the gate electrode material film on the side and bottom surfaces of the trench portion and the upper surface of the first oxide film.

13. The method of manufacturing the semiconductor device according to claim 10, further comprising:

forming a channel stopper region under an impurity diffusion drift layer formed on the surface of the high-withstand voltage active region by implanting an impurity ion of the first conductivity type.

14. The method of manufacturing the semiconductor device according to claim 13, wherein the step of forming the channel stopper region by implanting the impurity ion of the first conductivity type in under the impurity diffusion drift layer is performed between the step of forming the trench portion and the step of depositing the gate electrode material film.

15. The method of manufacturing the semiconductor device according to claim 14, wherein the step of forming the high-withstand voltage active region of the first conductivity type uses the same mask for implanting the impurity ion as the step of forming the channel stopper region.

16. The method of manufacturing the semiconductor device according to claim 10, wherein the step of forming the high-withstand voltage active region of the first conductivity type is performed between the step for forming the trench portion and the step of depositing the gate electrode material film.

17. The method of manufacturing the semiconductor device according to claim 10 further comprising:

forming a low-withstand voltage MOSFET, wherein the step for forming the low-withstand voltage MOSFET comprises:

forming a low-withstand voltage active region of the first conductivity type in at least one section of the active region, other than the high-withstand voltage active region after the element isolation region has been formed;

forming a gate oxide film for the low-withstand voltage MOSFET on a surface of the low-withstand voltage active region;

depositing a gate electrode material film for the low-withstand voltage MOSFET while depositing the gate electrode material film at the step of forming the high-withstand voltage MOSFET with the same material;

forming a low-withstand voltage gate electrode by patterning the gate electrode material film for the low-withstand voltage MOSFET while patterning the gate electrode material film at the step for forming the high-withstand voltage MOSFET; and forming a source region and a drain region for the low-withstand voltage MOSFET by implanting an impurity ion of the second conductivity type in the surface of the low-withstand voltage active regions on both sides of the low-withstand voltage gate electrode.

18. The method of manufacturing the semiconductor device according to claim 17, wherein the impurity ion implantation of the second conductivity type at the step of forming the source region and the drain region in the step of forming the high-withstand voltage MOSFET, and the impurity ion implantation of the second conductivity type at the step of forming the source region and the drain region in the step of forming the low-withstand voltage MOSFET are performed at the same time.

19. The method of manufacturing the semiconductor device according to claim 11 comprising forming a channel stopper region by implanting an impurity ion of the first conductivity type, the channel stopper region being formed in an inner region of the high-withstand voltage active region under a bottom of the trench portion, wherein the step of forming the channel stopper region is performed between the step of forming the trench portion, and the step of depositing the gate oxide film and the gate electrode material film on the side and bottom surfaces of the trench portion and the upper surface of the first oxide film.

20. The method of manufacturing the semiconductor device according to claim 11, further comprising:

forming a channel stopper region under an impurity diffusion drift layer formed on the surface of the high-withstand voltage active region by implanting an impurity ion of the first conductivity type.

21. The method of manufacturing the semiconductor device according to claim 20, wherein the step of forming the channel stopper region by implanting the impurity ion of the first conductivity type in under the impurity diffusion drift layer is performed between the step of forming the trench portion and the step of depositing the gate electrode material film.

22. The method of manufacturing the semiconductor device according to claim 21, wherein the step of forming the high-withstand voltage active region of the first conductivity type uses the same mask for implanting the impurity ion as the step of forming the channel stopper region.

23. The method of manufacturing the semiconductor device according to claim 11, wherein the step of forming the high-withstand voltage active region of the first conductivity type is performed between the step for forming the trench portion and the step of depositing the gate electrode material film.

24. The method of manufacturing the semiconductor device according to claim 11, further comprising:
forming a low-withstand voltage MOSFET, wherein the step for forming the low-withstand voltage MOSFET comprises:
   forming a low-withstand voltage active region of the first conductivity type in at least one section of the active region, other than the high-withstand voltage active region after the element isolation region has been formed;
   forming a gate oxide film for the low-withstand voltage MOSFET on a surface of the low-withstand voltage active region;
   depositing a gate electrode material film for the low-withstand voltage MOSFET while depositing the gate electrode material film at the step of forming the high-withstand voltage MOSFET with the same material;
   forming a low-withstand voltage gate electrode by patterning the gate electrode material film for the low-withstand voltage MOSFET while patterning the gate electrode material film at the step for forming the high-withstand voltage MOSFET; and
   forming a source region and a drain region for the low-withstand voltage MOSFET by implanting an impurity ion of the second conductivity type in the surface of the low-withstand voltage active regions on both sides of the low-withstand voltage gate electrode.

25. The method of manufacturing the semiconductor device according to claim 24, wherein the impurity ion implantation of the second conductivity type at the step of forming the source region and the drain region in the step of forming the high-withstand voltage MOSFET and the impurity ion implantation of the second conductivity type at the step of forming the source region and the drain region in the step of forming the low-withstand voltage MOSFET are performed at the same time.

* * * * *